United States Patent [19]

Hanna

[11] Patent Number: 5,057,800

[45] Date of Patent: Oct. 15, 1991

[54] APPARATUS AND METHOD FOR DIFFRACTING MSW IN A GARNET FILM USING SAW

[75] Inventor: Samy M. Hanna, Farmingdale, N.Y.

[73] Assignee: Polytechnic University, Brooklyn, N.Y.

[21] Appl. No.: 379,322

[22] Filed: Jul. 12, 1989

[51] Int. Cl.$^5$ .............................................. H03H 9/00
[52] U.S. Cl. ..................................... 333/133; 333/195
[58] Field of Search .................... 333/201, 202, 219.2, 333/133, 152-154, 195; 324/77 B, 82

[56] References Cited

U.S. PATENT DOCUMENTS

| | | | |
|---|---|---|---|
| 4,169,252 | 9/1979 | Muskiewicz | 333/205 |
| 4,614,919 | 9/1986 | Floyd | 333/133 |
| 4,716,390 | 12/1987 | Elliott et al. | 333/202 |
| 4,751,480 | 6/1988 | Kunz et al. | 333/219 |
| 4,762,383 | 8/1988 | Yamashita et al. | 350/96.13 |

OTHER PUBLICATIONS

Hanna et al., "Magnetoelastic Gain Associated with SAW Propagation in Magnetic Garnet Films," J. Appl. Phys. 61(8), Apr. 15, 1987, pp. 4148-4150.
Castera et al., "Magnetostatic Surface Wave Oscillators and Resonators", Proc. of the 8th European Microwave Conf. Sep. 4-8, 1978, pp. 658-662.
Hanna, S. M. and Zeroug, S.; "Single and Coupled MSW Resonators for Microwave Channelizers", *IEEE Transactions in Magnetics*, Nov. 1988.
Hanna, S. M. and Zeroug, S.; "Frequency Sorting Based on Planar YIG Resonators", *Proceedings of the 42nd Frequency Control Symposium*, 1988.
Hanna, S. M. and Murphy, G. P.; "Interactions Between Magnetostatic and Surface Acoustic Waves in Garnet Films", *IEEE Transactions on Magnetics*, Nov. 1988.

*Primary Examiner*—Eugene R. LaRoche
*Assistant Examiner*—Seung Ham
*Attorney, Agent, or Firm*—Curtis, Morris & Safford

[57] ABSTRACT

A method and apparatus for diffracting magnetostatic waves (MSW) in a garnet film by surface acoustic waves (SAW) so that spectral analysis may be performed on an input microwave signal having a plurality of frequency components. The garnet film, advantageously a YIG film, has a piezoelectric layer of zinc oxide which receives at an interdigital transducer an rf signal to propagate surface acoustic waves (SAW) in the YIG film. The SAW space and time modulates the properties of the YIG film as to diffract magnetostatic waves. A microwave input signal having a plurality of spectral components is supplied to the YIG film, as is a magnetic biasing field, whereby MSW propagates therein. Because of the diffraction of MSW caused by SAW, different spectral components of the microwave signal are obtained at different positions and are output at individual channels.

11 Claims, 2 Drawing Sheets 5,057,800

APPARATUS AND METHOD FOR DIFFRACTING MSW IN A GARNET FILM USING SAW

RELATED PATENT APPLICATIONS

U.S. patent application Ser. No. 360,216, filed June 2, 1989, the disclosure of which is incorporated herein by reference.

FIELD OF THE INVENTION

This invention relates to microwave devices having magnetostatic wave (MSW) propagation in a garnet film and, more particularly, to the use of surface acoustic waves (SAW) for diffracting magnetostatic waves in a garnet film to enable spectrum analysis of microwave signals of frequencies as high as 20 gigahertz (GHz) or more.

BACKGROUND OF THE INVENTION

Garnet films are used as the medium in which magnetostatic waves propagate. Epitaxially grown yttrium iron garnet (YIG) films, for example, exhibit low propagation losses for such magnetostatic waves. Typically, a YIG film is grown on a non-magnetic substrate such as gadolinium gallium garnet (GGG) and exposed to a biasing magnetic field to support the propagation of magnetostatic waves in the film. Magnetostatic waves can be excited by using microstrip structures, while surface acoustic waves can be excited by using an interdigital transducer receiving an rf signal. Acousto-optic Bragg diffractors using surface acoustic wave propagation are limited by SAW technology to operating frequencies of less than 2 GHz.

Garnet film devices are useful for microwave integrated circuit filters due to high Q value resonance characteristics in the microwave frequency band, compact structure, and suitability for mass production by selective patterning processes. In general, garnet film devices have applications for microwave filters, oscillators, instrumentation and communication systems.

Conventionally, as shown in FIG. 1, a microwave channelizer 30 may be comprised of several delay lines 32a, 32b, 32c, ... forming a filter bank wherein each delay line comprises a separate channel for filtering a signal of particular frequency from a wide band microwave input signal $S_i$. Each channel includes identically proportioned YIG films which are subjected to a gradient of a magnetic biasing field (not shown). Thus, each delay line is exposed to a magnetic biasing field with a different intensity, and as a result has a different center frequency. The channelizer enables spectral analysis of a microwave input signal by receiving the input signal $S_i$ at each resonator and passing as the output signal $S_o$ from that resonator, the signal component within a narrow band of frequencies about the delay line's center frequency.

In an alternative approach, the delay lines constituting the different channels are replaced by resonators similar to those shown in FIG. 2. The same uniform magnetic field is applied to all of the resonators and center frequency tuning is accomplished by prescribing the dimensions of the YIG film.

Referring to FIG. 2, a typical YIG resonator 10 is shown in which a YIG film 12 of thickness d is epitaxially grown in a non-magnetic GGG substrate 14. Two microstrip lines 16,18 couple microwave energy into and out of the resonator 10 to provide the respective input and output signal paths. The lines 16,18 are provided on a dielectric material 20 of height h, and the YIG film 12 is disposed on that same material which separates the lines 16,18 and the film 12 from a metallic ground plane 22.

Magnetostatic waves typically are generated by passing current through a wire or conductor (such as lines 16 and 18) adjacent to the YIG film. The rf magnetic field surrounding the wire induces MSW propagation in the YIG film. The YIG film functions, in effect, as a waveguide.

A forward surface wave is generated in the film 12 if a magnetic biasing field H is applied in the plane of the YIG film perpendicular to the direction of propagation. A forward volume wave is generated if the magnetic biasing field H is applied normal to the plane of the YIG film 12. A backward volume wave is generated if the magnetic biasing field H is in the plane of the YIG film in the direction of propagation. As illustrated, the magnetic biasing field $H_o$ is applied normal to the plane of the YIG film 12 to cause magnetostatic forward volume waves.

OBJECTS OF THE INVENTION

It is an object of this invention to provide another approach to separating microwave signals into different output channels according to their frequencies.

Another object is to use a garnet film in which surface acoustic waves alter the properties of the magnetic film with a periodicity over space and time to diffract the MSW.

It is an additional object of this invention to provide a method and apparatus for diffracting MSW in a garnet film using SAW to modulate the properties of the film.

It is a further object of this invention to spectrally analyze an input microwave signal by generating spectral component output signals with a frequency as high as 20 GHz or more in which SAW is used in a garnet film to form, in effect, a Bragg cell, to modulate the properties of the film and diffract the spectral components of the input MSW signal to varying degrees at various positions along the surface of the film.

SUMMARY OF THE INVENTION

These and other objects are provided by a method and apparatus for performing spectral analysis of a microwave input signal using a garnet film, preferably, a YIG film. Surface acoustic waves are introduced into a magnetic garnet film which is exposed to a magnetic biasing field that induces magnetostatic wave propagation. As the acoustic waves propagate in the film, magnetoelastic coupling occurs between the elastic strain fields caused by the SAW and the magnetic spin system of the magnetic film. The SAW slightly modulates the characteristics of the magnetic medium. In effect, the acoustic wave functions in a manner analogous to that of an acousto-optic Bragg cell to diffract the magnetostatic waves (rather than optic waves) and, in this case, the signal to be analyzed is fed as a MSW. As a result, spectral analysis of a microwave input signal can be attained for operating frequencies as high as 20 GHz or more, in which output signals taken at various positions on the film correspond to spectral components of the microwave input signal.

DETAILED DESCRIPTION

Figure 1:
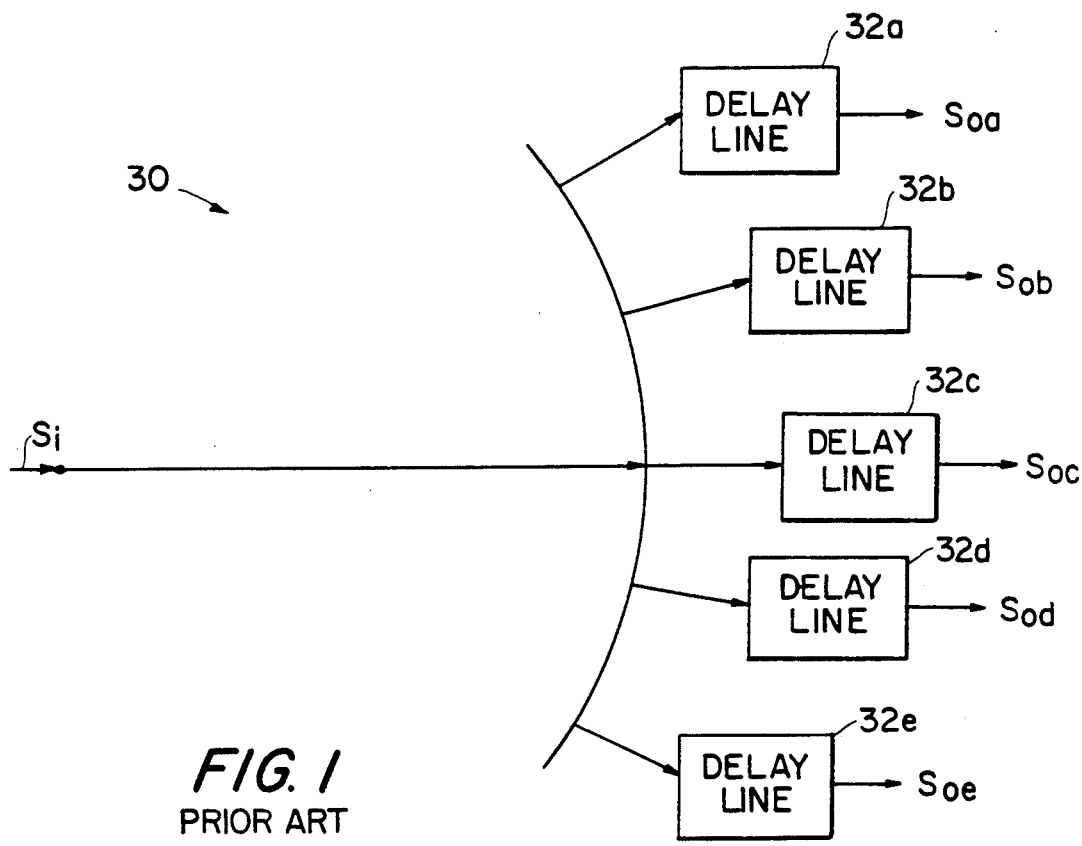
FIG. 1 is a diagram of a conventional microwave channelizer using a magnetic bias field gradient.
Figure 2:
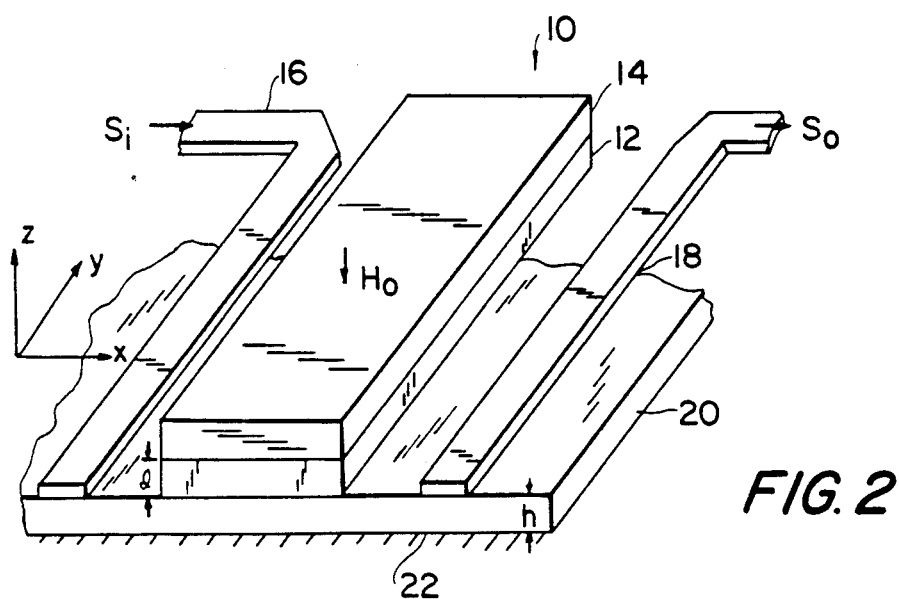
FIG. 2 is a diagram of a configuration of a YIG resonator disclosed in copending application No. 360,216.
Figure 3:
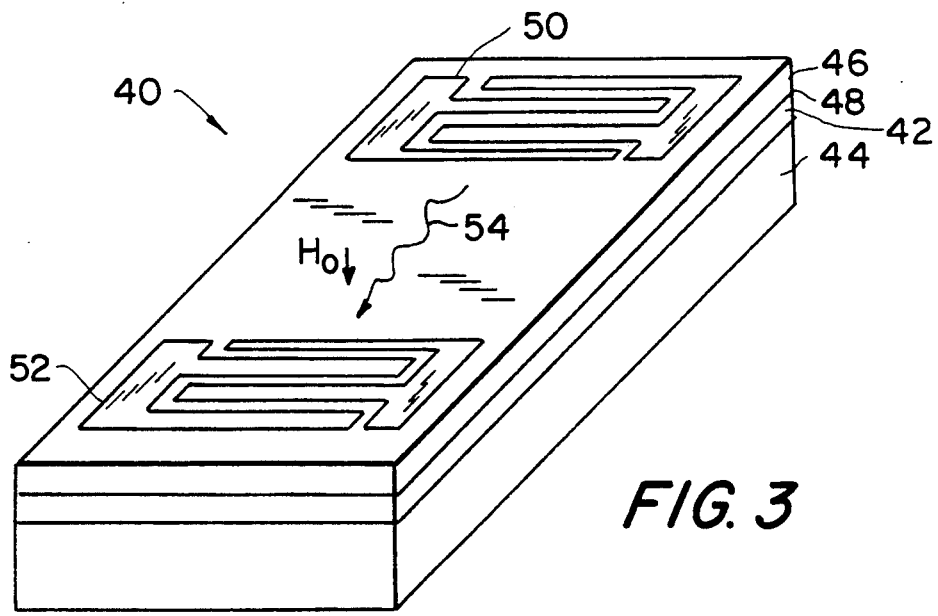
FIG. 3 illustrates a configuration for a device for excitation of surface acoustic waves in a garnet film.

Referring to FIG. 3, an yttrium iron garnet (YIG) film configuration for propagating surface acoustic waves is shown. A YIG film 42 grown on a nonmagnetic substrate 44, such as gadolinium gallium garnet (GGG), has a piezoelectric layer 46 of zinc oxide (ZnO) thereon. In one embodiment the ZnO layer 46 is made up of layers formed by sputter depositing polycrystalline ZnO films. A thin film 48 of aluminum (Al) separates the ZnO layer from the YIG film 42 and another aluminum film 49 is deposited by evaporation on top of the ZnO layer. Al film 49 is etched to form an interdigital transducer using conventional photolithographic techniques. Interdigital transducers 50,52 are formed on the ZnO layer 46 enabling an rf signal to be applied to the device for producing surface acoustic waves (SAW) 54 which propagate in YIG film 42.

As acoustic waves propagate in the YIG film, magnetoelastic coupling between the elastic strain fields of the ZnO layer 46 and the magnetic spin system of the YIG film 42 occurs. Magnetoelastic coupling results from the combined action of the spin-orbit coupling and the deformed crystal potential. When neighboring ions in the magnetic crystal are displaced by the stress of the acoustic wave, an alternation in charge distribution results causing changes in the orbital angular momentum. Consequently, the magnetization of the crystal changes. Thus, the acoustic wave slightly modulates the magnetic properties of the YIG film 42. The SAW effect, thus, has a space and time periodicity modulating the magnetic medium formed of YIG film 42.

When a magnetic biasing field is applied, the YIG film 42 supports a MSW and the magnetoelastic effect manifests as a change in the propagation characteristic of the acoustic and magnetostatic waves. As the elastic modes caused by SAW couple with the propagation of MSW, ripples as high as 3 dB have been observed in the passbands of magnetostatic surface wave filters. A similar effect is observed for magnetostatic forward volume wave delay lines.

Figure 4:
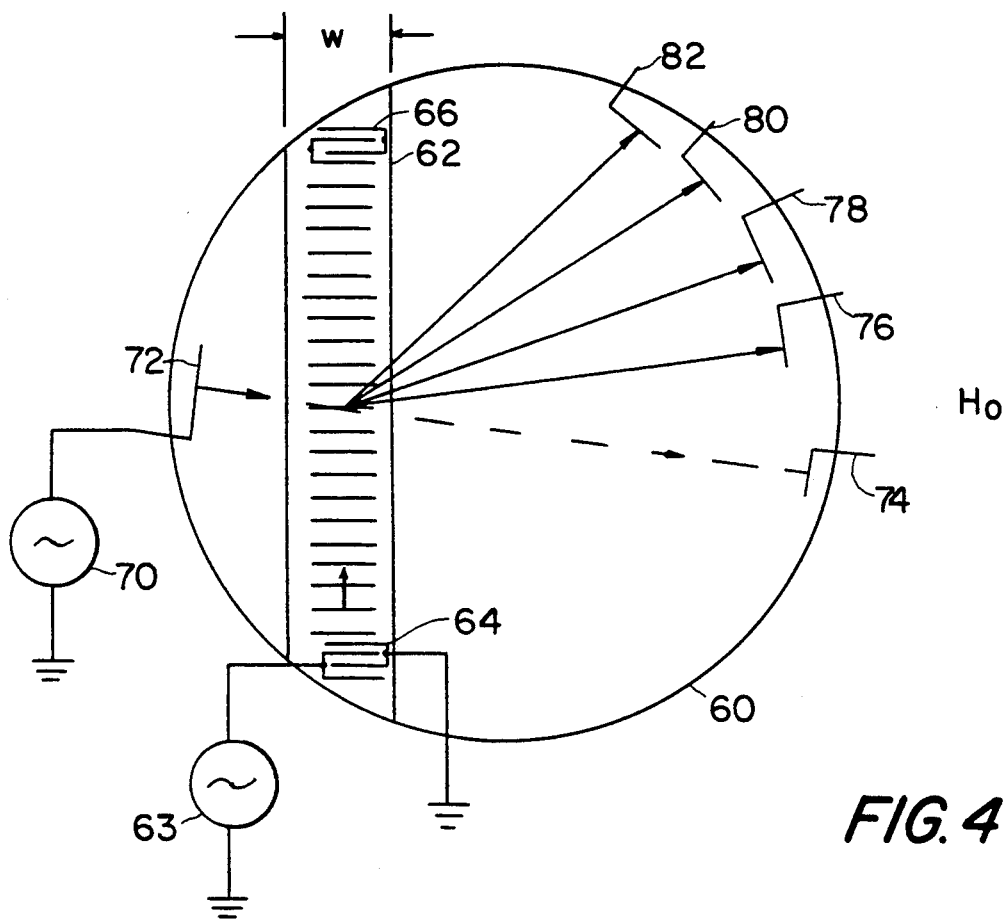
FIG. 4 is a schematic representation of a MSW-SAW microwave spectrum analyzer according to this invention.

Referring to FIG. 4, a schematic representation of an MSW-SAW microwave integrated tunable spectrum analyzer based on this invention is shown. A wafer 60 made of a YIG film grown on a non-magnetic substrate, such as GGG, has a piezoelectric film 62 of ZnO deposited over a portion of the wafer surface. Interdigital transducers 64, 66 are located on the ZnO film 62 for receiving an rf signal generated by an oscillatory source 63 so as to cause surface acoustic waves to propagate in the YIG film. Microstrip structures 72 are excited by a microwave source 70 to excite MSW in the YIG film.

Depending on the magnetic biasing field orientation, different MSW modes of propagation can be excited. Magnetostatic forward volume waves are preferred because of the nearly isotropic propagation characteristics in the plane of the wafer 60. As illustrated, a magnetic biasing field $H_o$ is applied normal to the plane of the wafer 60 causing magnetostatic forward volume waves.

In the configuration shown in FIG. 4, and in the absence of the SAW, the magnetostatic wave is undiffracted, producing a narrow band output at contact 74. The SAW however, causes space and time periodicity modulating the properties of the YIG film. The acoustic waves, in effect, produce a Bragg cell that diffracts the MSW. When Bragg's condition is satisfied, only the first order diffracted MSW will diffract in-phase. All other orders are out of phase and destructively interfere so as to decrease in amplitude. With the transducers 64,66 driven at a constant frequency, and depending on the frequency of the microwave input signal, the angle of deflection of the MSW will vary so as to conserve momentum.

Because the MSW and SAW beams are of finite width, the Bragg diffracting occurs over a range of frequencies, not just a single frequency as in the case of infinitely wide beams. The range of frequencies determines the bandwidth for a given bias field. By scanning the bias field, the operating frequency can be swept up to 20 GHz or more.

Spectral analysis of a broadband microwave signal can be resolved spatially across the wafer 60. During the spatial and time periodicity of the YIG film properties, different frequencies in the microwave signal are deflected at different angles. Thus, different spectral components of the input signal are diffracted by different degrees to provide corresponding output signals at the locations 76,78,80,82 which, in effect, define respective frequency channels.

While embodiments of the invention have been illustrated and described, the invention is not intended to be limited to the exact embodiments illustrated. The scope of the invention is intended to be determined by the claims and their equivalents interpreted in light of the prior art.

What is claimed is:

1. A method for diffracting magnetostatic waves in a garnet film by varying the characteristics of the film with spatial and time periodicity, a portion of the garnet film having a piezoelectric layer with an interdigital transducer, the method comprising the steps:

inputting a first signal to the interdigital transducer to propagate surface acoustic waves in the garnet film;

exposing the garnet film to a magnetic biasing field; and exciting magnetostatic waves (MSW) in said garnet film whereby the surface acoustic waves cause a space and time modulation of the properties of the film so as to form an effective Bragg cell for diffracting the magnetostatic waves supplied thereto.

2. The method of claim 1, further comprising inputting a microwave signal to the garnet film while the surface acoustic waves modulate the characteristics of the film so as to diffract the spectral components of the microwave signal by varying degrees; and outputting a plurality of output signals, each output signal corresponding to a spectral component of the microwave signal.

3. A method for spectrally analyzing a microwave input signal using a medium comprised of a garnet film which when exposed to a magnetic biasing field, supports a magnetostatic wave (MSW), a portion of the garnet film having a piezoelectric layer with an interdigital transducer, the method comprising the steps:

inputting a first signal to the interdigital transducer to propagate surface acoustic waves (SAW) in the garnet film to modulate the properties of the medium for diffracting magnetostatic waves (MSW) propagating in said film;

exposing the garnet film to a magnetic biasing field;

inputting to the garnet film a microwave signal having a plurality of spectral components to propagate MSW therein, respective spectral components of the MSW being diffracted to a different degree by said SAW; and outputting from the garnet film a plurality of output signals, each output signal corresponding to a respective spectral component of the microwave signal.

4. The method of claim 3, wherein the magnetic biasing field is exposed normal to the plane of the film so as to cause magnetostatic forward volume waves in the film.

5. The method of claim 3, wherein the first signal input to the interdigital transducer is an rf signal.

6. Signal processing apparatus operating in the microwave frequency range, comprising:

a garnet film having a piezoelectric layer;

an interdigital transducer on the piezoelectric layer receiving a first signal which causes surface acoustic waves (SAW) to propagate in the garnet film for modulating the properties of the film and diffracting magnetostatic waves propagated therein;

means for applying a magnetic biasing field to the garnet film;

means for supplying a microwave input signal to the film for propagating a magnetostatic wave (MSW), said MSW having a plurality of spectral components, respective ones being diffracted to a different degree by the film; and means for outputting signals with different frequencies to different output channels.

7. The apparatus of claim 6, wherein the magnetic biasing field is applied normal to the plane of the garnet film so as to propagate magnetostatic forward volume waves therein.

8. The apparatus of claim 6, further comprising means for applying an rf signal as said first signal to the interdigital transducer.

9. The apparatus of claim 6, wherein the piezoelectric layer comprises a zinc oxide film.

10. The apparatus of claim 9, wherein the piezoelectric layer further comprises an aluminum film separating the zinc oxide film from the garnet film.

11. The apparatus of claim 6, wherein the garnet film comprises an yttrium iron garnet film on a gadolinium gallium garnet substrate, the piezoelectric layer being deposited on the yttrium iron garnet film.

* * * * *